United States Patent [19]

Jain et al.

[11] 4,119,994
[45] Oct. 10, 1978

[54] HETEROJUNCTION AND PROCESS FOR FABRICATING SAME

[75] Inventors: Faquir Chand Jain, Storrs; Mahmoud Ahmed Melehy, Baltic, both of Conn.

[73] Assignee: University of Connecticut, Storrs, Conn.

[21] Appl. No.: 604,794

[22] Filed: Aug. 14, 1975

Related U.S. Application Data

[63] Continuation-in-part of Ser. No. 434,707, Jan. 18, 1974, abandoned.

[51] Int. Cl.² .................... H01L 29/267; H01L 29/205
[52] U.S. Cl. .......................... 357/16; 357/30; 357/34
[58] Field of Search .............................. 357/16, 34, 30

[56] References Cited

U.S. PATENT DOCUMENTS

| | | | |
|---|---|---|---|
| 3,211,970 | 10/1965 | Christian | 357/16 |
| 3,217,214 | 11/1965 | Tummers | 357/16 |
| 3,249,473 | 5/1966 | Holonyak | 357/16 |
| 3,466,512 | 9/1969 | Seidel | 357/16 |
| 3,780,359 | 12/1973 | Dumke et al. | 357/16 |

OTHER PUBLICATIONS

Milnes et al., Heterojunctions and Metal–Semiconductor Junctions, (Academic Press, NY, 1972) pp. 7–9, 58–93, 201–280.

Primary Examiner—William D. Larkins
Attorney, Agent, or Firm—Hopgood, Calimafde, Kalil, Blaustein & Lieberman

[57] ABSTRACT

Heterojunction devices including heterotransistors and heterodiodes are disclosed which exhibit improved high-frequency, efficiency, and power characteristics. The heterotransistor in one embodiment includes a wide-gap collector and in another embodiment includes a wide-gap isotype emitter having regions of different impurity doping levels. A heterodiode includes a similar wide-gap isotype emitter. Also disclosed are a heterojunction microwave diode and two types of heterojunction photocathodes. The microwave diode and one of the photocathodes are characterized by the occurrence of avalanche at the heterojunction.

6 Claims, 19 Drawing Figures

HETEROJUNCTION AND PROCESS FOR FABRICATING SAME

This application is a continuation-in-part of application Ser. No. 434,707 filed on Jan. 18, 1974 now abandoned, for Heterojunction Devices.

The present invention relates generally to semiconductor devices, and more particularly to semiconductor devices including a heterojunction.

A heterojunction is formed at the interface between two semiconductor regions having different energy gaps which are united as continuous single crystalline material. The basic heterojunction structure was conceived and investigated in about 1950. Although it has long been believed that the heterojunction devices possess potential operating characteristics that are superior to those of the homojunction devices, repeated attempts at implementing practical and commercially viable heterojunction devices have met with no significant success except for a limited use in lasers. Thus, despite the considerable amount of work that has been done over the years with heterojunction semiconductor devices, such as diodes and heterojunction transistors, heterojunction devices have found only minimal practical utility. As a result, the overwhelming majority of commercial semiconductor devices are of the homojunction type.

In spite of the interest in heterojunction devices shown in the art, with the possible exception of laser diodes, there have been relatively little commercial fabrication and use of heterojunction devices. At least part of the reason for this poor acceptance of heterojunction devices lies in the poor lifetimes of minority carriers in fabricated devices which results in soft reverse characteristics in diodes and unacceptably low amplification properties in transistors as compared to homojunction devices.

It is an object of the invention to provide heterojunction devices capable of operating at higher frequencies than has heretofore been possible.

It is another object of the invention to provide heterojunction devices including diodes and transistors capable of operating at higher power levels at a given high frequency than has heretofore been possible.

It is a further object of the invention to provide a heterojunction device capable of operating at significantly higher forward dc voltages at relatively low dc current densities and having greater dynamic input impedances than has heretofore been possible in bipolar junction devices.

It is yet a further object of the invention to provide an improved heterojunction avalanche or IMPATT diode capable of operating at higher frequencies and at higher power levels than has been heretofore attainable in diodes of this type.

It is still a further object of the invention to provide a heterojunction photocathode characterized by higher conversion efficiency and increased sensitivity to infrared radiation.

To these ends, the present invention is directed toward improvements in heterojunction devices including heterodiodes, heterojunction transistors, and heterojunction avalanche diodes which have improved frequency and power characteristics. The heterotransistor of the invention, in one embodiment, includes a wide-gap isotype emitter having regions of different impurity doping levels. In a second embodiment, the heterotransistor of the invention includes a wide-gap collector. In a third embodiment, the heterotransistor includes a wide-gap isotype emitter and a wide-gap collector sandwiching a narrow-gap base.

A heterodiode is disclosed which includes a similar wide-gap isotype emitter. The heterojunction avalanche diode of the invention is characterized by the occurrence of the avalanche at the heterojunction.

To the accomplishment of the foregoing and other objects as may hereinafter appear, the present invention relates to improved heterojunction devices as described in the following detailed specification taken in conjunction with the accompanying drawings in which:

In FIGS. 1-6 and 10, there are shown, for the sake of completeness, complementary versions of various embodiments of heterojunction devices according to the invention. However, for the sake of conciseness, description in the following portion of the application is given of only the embodiment shown in the (a) portion of each of these Figures, it being understood that the complementary version illustrated in the (b) portion of the Figures is the same as that in the (a) version except for a reversal of conductivity types in the various regions of the devices.

Figure 1A:
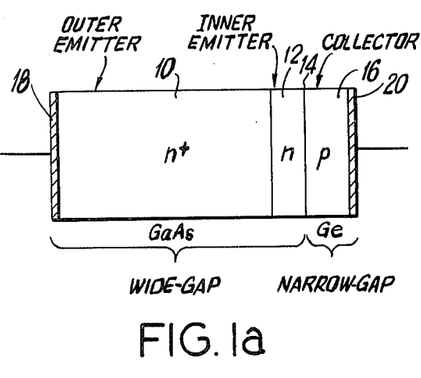
FIGS. 1a and 1b are diagrammatic illustrations of complementary heterojunction diodes according to one embodiment of the invention.
Figure 1B:
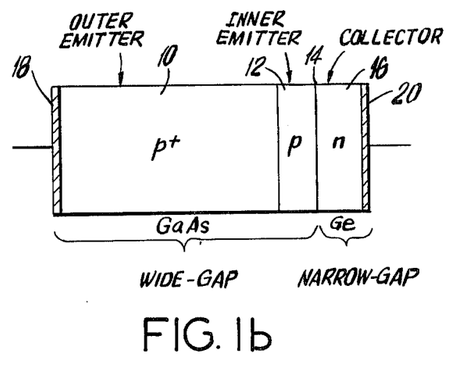

The heterodiode shown in FIG. 1 includes an emitter formed of a wide-gap material such as GaAs and a collector of a narrow-gap material such as Ge. In FIG. 1a, the emitter is an n-type region and the collector is of p-type conductivity. The emitter region of the diode includes two regions of the same conductivity type, an outer emitter region 10 and an inner emitter region 12 adjacent to a p-n heterojunction 14. A collector region 16 of a conductivity type opposite to that of the emitter is at the other side of the heterojunction. The doping level of outer emitter region 10 is higher than that of the inner emitter region and may be between about $10^{18}/cm^3$ to $10^{21}/cm^3$, depending on the solid solubility of the dopant used.

The doping level of the inner emitter region may be between $10^{13}/cm^3$ and $10^{17}/cm^3$ and preferably is between $10^{15}cm^3$ and $10^{17}/cm^3$. The doping level of the collector region may be between $10^{13}/cm^3$ and $10^{19}/cm^3$ and is preferably between $10^{16}/cm^3$ and $10^{18}/cm^3$. To complete the diode, ohmic contacts are made to the emitter and collector respectively at contacts 18 and 20.

The isotype $p^+$-p (or $n^+$-n) emitter regions of the heterodiode of FIG. 1, serves (1) to reduce the ohmic losses resulting from the low conductivity of the inner emitter region; (2) to provide an additional forward diode voltage at any emitter current; and (3) to provide improved ohmic contact. Moreover, the provision of the high doping concentration outer emitter region permits the use of a relatively low concentration inner emitter region with the advantages described below with lower capacitance at the heterojunction and increased forward voltage thereat.

Figure 2A:
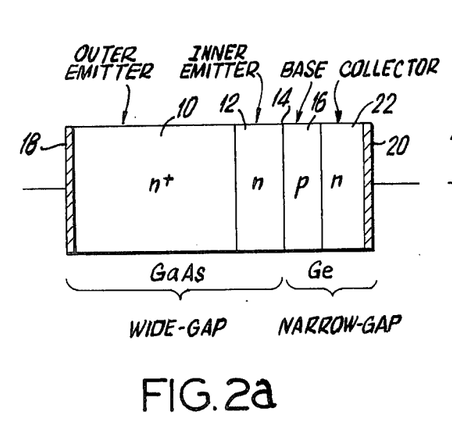
FIGS. 2a and 2b are diagrammatic representations of complementary heterojunction transistors according to the invention.
Figure 2B:
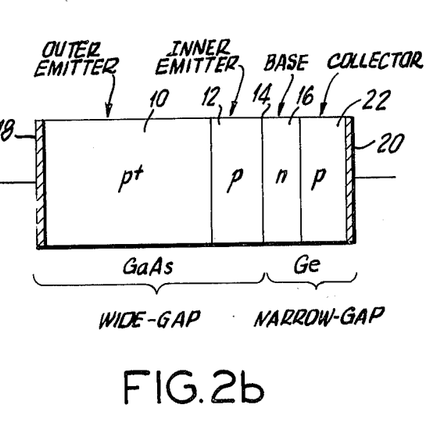

FIGS. 2a and b illustrate two heterotransistors employing the heterodiodes of FIGS. 1a and b, respectively, as their emitter-base regions, and further including a collector region 22 of opposite conductivity type to that of the base region and being of the same narrow-gap material, here, Ge, as the base region, thereby forming a collector-base p-n homojunction made of a narrow-gap material. The doping level of the base region may be relatively high and even higher than that in the emitter region without impairing the desirable high emitter-base junction injection efficiency. Higher doping levels of the base region, on the other hand, will reduce the expansion of the back-biased base-collector junction into the base region. This feature makes it possible to have the base region thinner than would otherwise be possible, without a punchthrough breakdown. The preferred base doping level is in the range of about $10^{16}$ to $10^{18}/cm^3$, whereas the preferred collector doping level is in the range of $10^{14}/cm^3$ to $10^{16}/cm^3$. Selection of the base doping level may be based on the collector junction breakdown voltage.

Figure 3A:
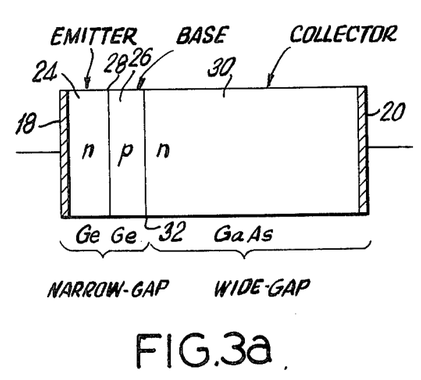
FIGS. 3a and 3b are diagrammatic representations of complementary heterojunction transistors according to an alternate embodiment of the invention.
Figure 3B:
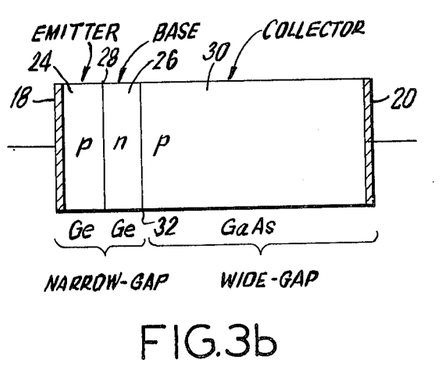

FIGS. 3a and b illustrate a transistor with an emitter homojunction and a collector heterojunction. As shown in FIG. 3a, the transistor includes a narrow-gap n-type emitter region 24 and a p-type base region 26 formed of the same narrow-gap material, Ge, as the emitter region and forming a p-n homojunction 28. The n-type collector region 30 is formed of a wide-gap material (GaAs) and forms a heterojunction 32 with the base region. The ratio of the emitter to base doping levels is preferably about 100 or higher to ensure a desirable high injection efficiency and the base doping level is advantageously between $10^{16}/cm^3$ and $10^{19}/cm^3$.

In accordance with one aspect of the heterotransistor, the doping level of the collector region may be substantially less than that of the base region. This produces at least the follwing advantages: (1) upon reversebiasing the base-collector heterojunction, widening of the junction takes place almost entirely in the collector region rather than in the base region, thereby virtually eliminating the punchthrough breakdown problem; and (2) the base-collector capacitance is reduced. Since the collector junction capacitance in a heterotransistor is substantially more important than the emitter base junction capacitance in improving the high-frequency characteristics of the device, this reduction in the collector capacitance provided in the heterotransistor of FIG. 3 makes this heterotransistor highly suitable for use in high-frequency applications in frequency regions thus far unattainable in the prior art homojunction transistors.

As an example, GaAs-Ge heterodiodes have been fabricated by the applicants which have exhibited low zero-bias heterojunction capacitance in the order of 58.3 to 195.7 pf/cm². In addition, the wide-gap collector of the transistor of FIG. 3 results in reduced reverse saturation current, even under the conditions when the collector is extremely lightly doped. In contrast, in prior art homotransistors, a lightly doped collector formed by using a narrow-gap material gives rise to a relatively high reverse saturation current. The base region of the transistor of FIG. 3 can thus be made much thinner without punch-through breakdown and yet with an extremely low reverse saturation current.

Figure 4A:
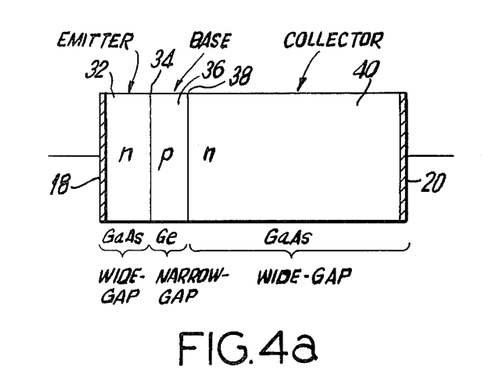
FIGS. 4a and 4b are diagrammatic representations of another embodiment of a heterojunction transistor according to the invention.
Figure 4B:
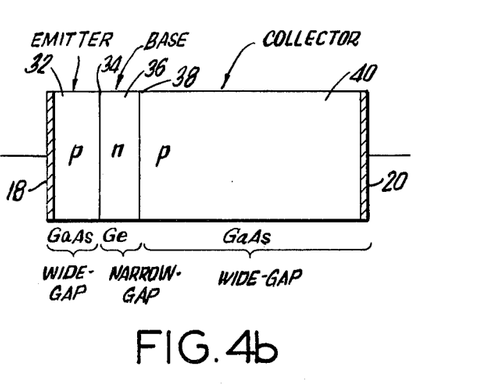
Figure 5A:
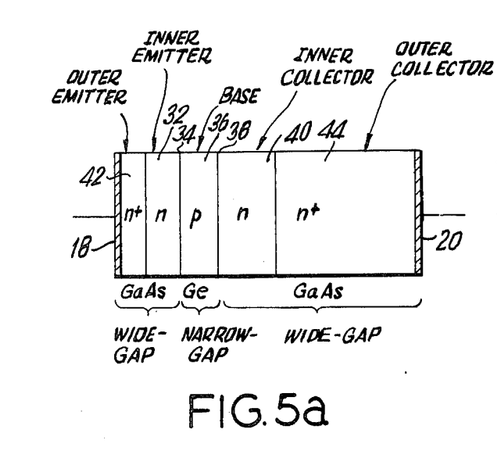
FIGS. 5a and 5b are diagrammatic representations of yet another heterojunction transistor according to the invention.
Figure 5B:
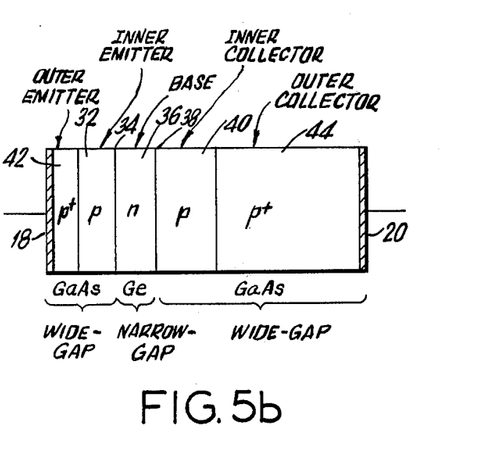

In the double heterotransistor structures illustrated in FIGS. 4a and 4b, both the emitter junctions as well as the collector junctions are heterojunctions. The role of the collector junction is the same as described in reference to the transistors illustrated in FIG. 3. In contrast to the transistor of FIG. 3, the transistor illustrated in FIG. 4 includes a wide-gap material (GaAs) emitter 32 forming a heterojunction 34 with a narrow-gap material (Ge) base region 36 of an opposite conductivity type. A second heterojunction 38 is formed between the base region and a wide-gap material collector region 40.

The emitter heterojunction of the transistor of FIG. 4 exhibits a reduced emitter-base capacitance, provided that sufficiently low emitter doping levels are selected; the emitter doping level is preferably in the range of $10^{14}/cm^3$ to $10^{17}/cm^3$ whereas that for the base region is in the range of about $10^{16}/cm^3$ to $10^{19}/cm^3$. The transistor structure of FIG. 4 exhibits improved frequency performance and higher injection efficiency the current gain as compared to the transistor structure of FIG. 3. The use of a wide-gap emitter in the transistor of FIG. 4 provides high injection efficiency of the emitter even with very low emitter doping levels.

In the transistor structure of FIG. 4, the base region is sandwiched between lightly doped emitter and collector regions. Therefore, the width of the base region can be made much thinner, in the range of about 0.05 microns, than has been possible in the prior art, whereas the doping levels of the base region can be made as desired, and may be in the range as high as $10^{18}/cm^3$ to $10^{19}/cm^3$.

The transistor shown in FIG. 5 is similar to that illustrated in FIG. 4 and further includes a high conductivity layer such as the $n^+$-GaAs outer emitter 42 and the $n^+$ outer collector 44 respectively grown on the outer sides of the emitter and collector regions 32 and 40 to reduce the ohmic losses thereat and to make it possible to achieve the other advantages described earlier for heterojunction diodes.

The heterotransistor shown in FIG. 6 includes a GaAs base region 46 sandwiched between an $Al_xGa_{1-x}As$ emitter 48 and an $Al_xGa_{1-x}As$ collector region 50, thereby providing a double heterojunction structure. The collector is, in turn, grown on a highly n-doped GaAs substrate 52.

To achieve optimum characteristics, including the desired low heterojunction capacity, long minority carrier lifetime and high injection efficiency, the monocrystalline semiconductor materials comprising the heterojunctions of FIGS. 1–6 should preferably meet the following requirements: (1) the lattice parameters of the wide-gap and narrow-gap materials should be as close to each other as possible and desirably the lattice mismatch should not be more than 1 percent; (2) the coefficient of thermal expansion of the two materials should be about the same at the temperature of the growth and also at the room temperature to minimize the strain at the hetero-interface; (3) the process of growing these regions should be such as to minimize autodoping or cross-diffusion effects; (4) if the regions are grown epitaxially by any of the known methods, the layers should have minimum crystalline defects including dislocations; (5) the grown layers should be mirror-smooth and structureless under a magnification of up to 2000X; (6) the grown layer should have carrier mobility and minority carrier lifetime nearly as high as in the bulk crystals of the same material, conductivity type, dopant, and dopant concentration; and (7) the lattice structure of the two regions should generally be the same so that all the regions of the lattice and the junction, or junctions therebetween form a single crystalline structure with minimum crystalline defects.

The heterostructures described in FIGS. 1–5 have been specifically described as employing GaAs and Ge as the wide-gap and narrow-gap materials, respectively, and these materials meet the compatibility requirements just described. Ge/GaAs heterojunctions have been fabricated by the applicants without autodoping or cross diffusion effects by using relatively lower growth temperatures.

Figure 7:
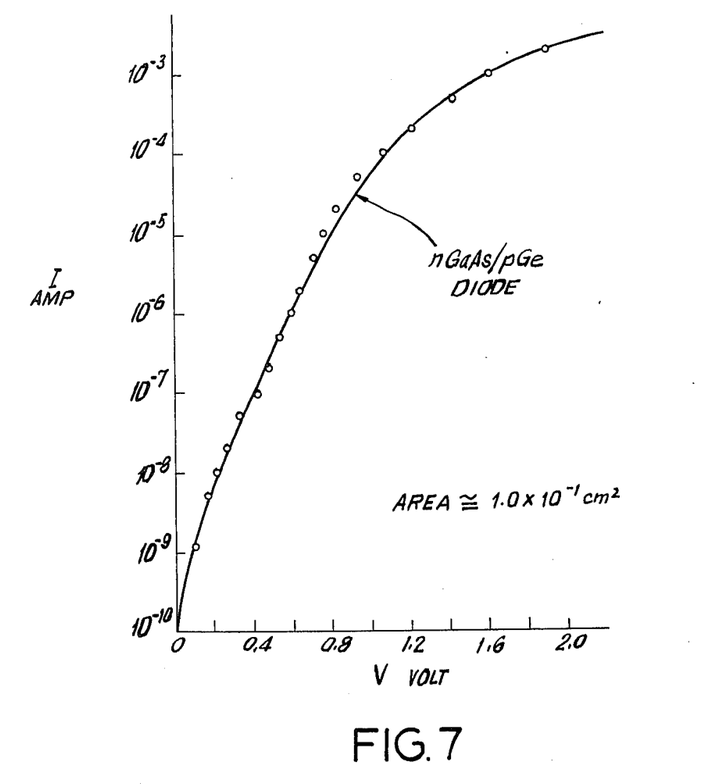
FIG. 7 represents a plot of the forward voltage-current characteristic of an nGaAs-pGe heterodiode according to the invention exhibiting a significantly high forward voltage at relatively low forward current densities.
Figure 8:
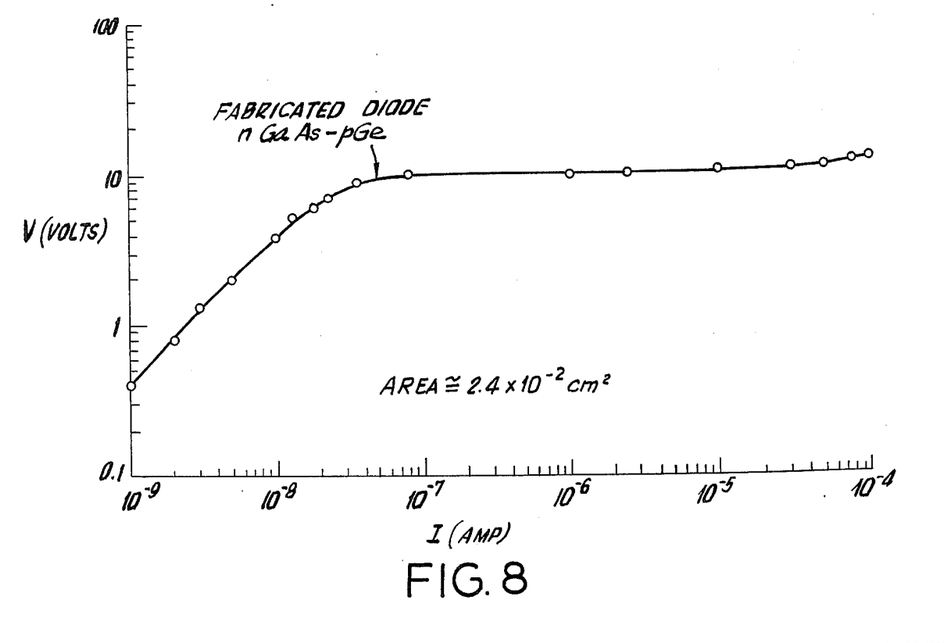
FIG. 8 represents a plot of the reverse voltage-current characteristic of an nGaAs-pGe heterodiode according to the invention which exhibits a hard reverse electrical characteristic.

One method of fabricating Ge-GaAs heterojunctions used was to deposit suitably doped Ge layers by using vapor phase epitaxial techniques on the GaAs substrates. The low temperature $GeI_2$ disproportionation reaction in an open tube transport system has been successfully used to grow high quality p-type and n-type single crystalline Ge epitaxial layers on GaAs substrates in a temperature range of about 330°–420° C. These epitaxial layers have exhibited Hall mobilities as high as that of bulk crystals which have the same conductivity type and doping levels. The grown layers meet all other specifications cited above. The growth rates of these layers range from about 1 micron to 8 microns/hr., depending on the growth conditions, which, in case of the $GeI_2$ disproportionation reaction, for example, includes the following: (1) the iodine source vapor pressure; (2) the carrier gas flow velocity; (3) the Ge source temperature; and (4) the seed temperature. Lower growth rates are particularly desirable in the deposition of very thin base regions of heterotransistors. Also the lower growth temperatures virtually eliminate any autodoping or cross diffusion effects. The minority carrier lifetime has also been extremely high indicating the presence of minimal interfacial crystalline defects. In addition, the zero forward bias capacitance of fabricated nGaAs-pGe heterojunctions has been found to be extremely low. FIGS. 7 and 8 represent the forward and reverse voltage-current characteristics of these heterojunctions, respectively.

The heterodiode of FIG. 1 can be readily fabricated by depositing a suitable Ge epitaxial layer on a GaAs substrate by using the low temperature process described above. The combination of Ge and GaAs meets the requirements of compatability for a heterojunction. The electric current and power handling capability of these diodes can further be improved by providing an additional highly doped outer emitter region. In this case, $n^+$GaAs can be selected as a starting substrate with an epitaxial nGaAs layer of the desired low doping levels. As discussed earlier, this isotype emitter has several advantages which result in improved performance.

The heterotransistor of FIG. 2 incorporate the heterodiode of FIG. 1 as the emitter and base regions of the transistor. To fabricate the transistor structure, an additional n-type or p-type Ge layer is grown on the Ge layer already grown to form the collector region. Compatible semiconductor materials other than Ge and GaAs could be employed to fabricate these structures to optimize their performance.

To realize the transistor structures shown in FIG. 3, a p-Ge layer followed by an n-Ge layer of any suitable doping level and thickness may be grown on an n-GaAs substrate to form the base and emitter regions, respectively. An $n^+$GaAs region may form the outer part of the collector region. The Ge epi layers are grown on the nGaAs layer and ohmic contacts may be attached to the $n^+$GaAs side. Conventional photolithographic techniques may be used to make ohmic contacts to the base and emitter regions.

The transistor structures of FIGS. 4 and 5 may be realized in part by using the fabrication steps described above in reference to the fabrication of the transistor of FIG. 3. In these structures, the emitter is made of a wide-gap semiconductor such as GaAs. The fabrication techniques of forming the base-emitter heterojunction should comply with the compatability requirements described earlier.

Figure 6A:
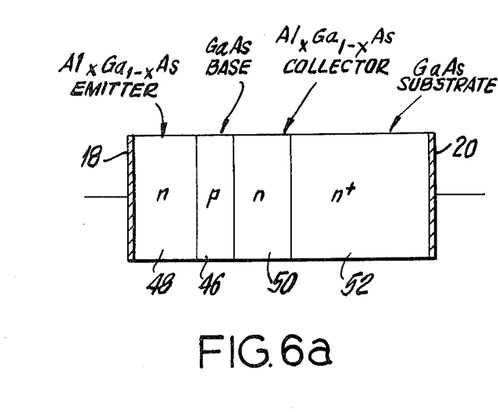
FIGS. 6a and 6b are diagrammatic representations of still a further embodiment of a heterojunction transistor according to the invention.
Figure 6B:
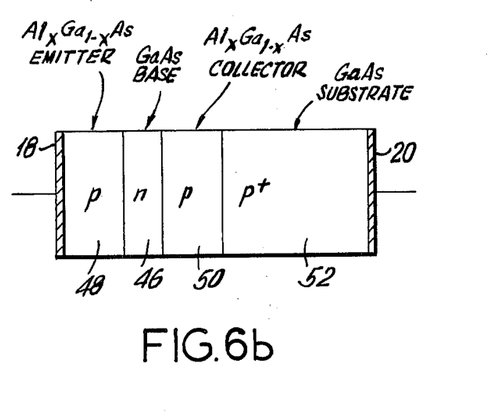

To realize the structures illustrated in FIG. 6, the starting substrate in the structure of FIG. 6a is an $n^+$GaAs substrate. An epitaxial layer of lightly doped n-type $Al_xGa_{1-x}As$ is grown on the $n^+$GaAs substrate by using methods known in the art (e.g. liquid phase epitaxial techniques). This layer serves as a collector. The base and emitter regions are formed by further epitaxially growing a preferably more heavily doped (compared with the collector layer) p-type GaAs layer and preferably a lightly doped (compared with the base region) n-type $Al_xGa_{1-x}As$ layer, respectively, on the collector layer. Since under actual electrical operation of the device, the expansion of the depletion layer at the collector-base heterojunction is into the lightly doped side, the heavily doped base eliminates any possibility of punchthrough breakdown of the base region. As described in FIG. 6, an additional layer of $n^+Al_xGa_{1-x}As$ can be put on the outer side of the emitter layer.

Although the use of Ge, GaAs and $Al_xGa_{1-x}As$ has been specifically disclosed in the fabrication of various structures of the invention, it is in the scope of this invention to use other compatible single crystalline semiconductor materials such as ZnSe, $In_xGa_{1-x}As$, $GaAs_xP_{1-x}$ and the like.

Figure 9:
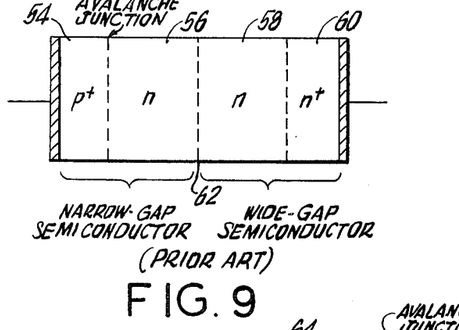
FIG. 9 is a diagrammatic representation of a prior art heterojunction avalanche diode.

FIG. 9 illustrates a prior art avalanche heterodiode disclosed in the Seidel U.S. Pat. No. 3,466,512. As shown, this device includes a low energy gap material including zones 54 and 56 of opposite conductivity types, and a wider gap semiconductor type, a heterojunction 62 being formed at the junction between zones 56 and 58. In the Seidel avalanche diode, avalanching occurs across the homojunction 64 defined by zones 54 and 56 in the narrow-gap material.

In the heterojunction avalanche diode of the invention, as illustrated in FIG. 10, the avalanche occurs across a lower capacitance heterojunction rather than a homojunction, thereby to provide improved diode performance at higher frequencies than was heretofore attainable.

Figure 10A:
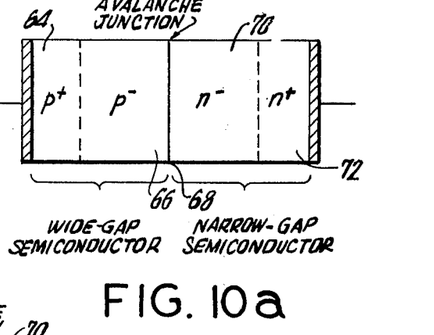
FIGS. 10a and 10b are diagrammatic representations of complementary heterojunction avalanche diodes according to the invention.
Figure 10B:
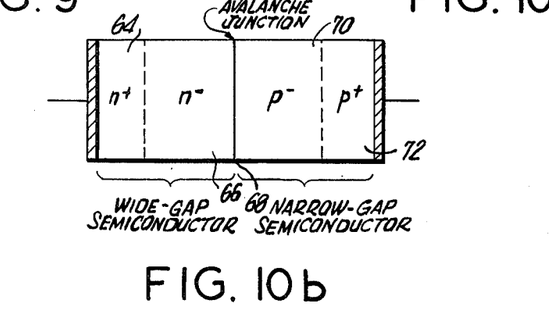

As seen in FIG. 10, the avalanche diode of the invention consists of a wide-gap emitter region and a narrow-gap base region of the opposite conductivity type. A heterojunction is established by these two regions. As shown in FIG. 10a, the p-type wide-gap region of the diode consists of two regions, an outer emitter region 64 whose doping level is designated by $p^+$ and an inner emitter region 66 whose doping level is designated by $p^-$. The doping level of inner emitter region 66 is preferably in the order of $10^{17}/cm^3$ to $10^{15}/cm^3$, and may, in some cases, be less than $10^{13}/cm^3$. The heavily doped $p^+$ outer emitter region 64 of which the doping level is in the range of $10^{18}/cm^3$ to $10^{21}/cm^3$ depending on the solid solubility of the dopant material, enables the formation of a good ohmic contact. Even with a low doping level of the inner emitter region 66, the wide-gap semiconductor material of that region is not intrinsic, but is still in the extrinsic range.

It may be desirable in some cases for the concentration of inner emitter region 66 to be much higher than $10^{17}/cm^3$ in which case that region and the $p^+$ outer emitter region 64 may merge to form a single indistinguishable region.

The narrow-gap n-type collector region of the avalanche diode of FIG. 10a may also, as shown, consist of two zones. The zone adjacent to the heterojunction 68 is the inner collector region 70, whereas the other constitutes an outer collector region 72. The doping concentration $n^-$ of zone 68 may be of the order of $10^{19}/cm^3$ to $10^{17}/cm^3$, or below. The value of $n^-$ (in the narrow-gap material) to a large degree determines the avalanche-breakdown voltage. If the resistivity of the inner collector region 68 is too high to make a good ohmic contact, it may be desirable to have $n^+$, the doping concentration of outer zone 72, be of the order of $10^{18}/cm^3$ to $10^{20}/cm^3$, or even higher. It is conceivable that in some cases the outer and inner collector regions 70 and 72 may merge to become one indistinguishable region.

A basic distinction between the IMPATT diodes of the prior art and those of the present invention, as exemplified by the diode of FIG. 10, is that in the prior art devices the avalanching junctions are homojunctions. In the diode of the invention, the avalanching diode is invariably a heterojunction; that is, avalanching occurs across the heterojunction.

Typical values for the heterojunction capacitance across which avalanche occurs can be low as the heterojunction capacitances listed previously in this specification, and the current-voltage characteristics of the diode are illustrated in FIGS. 7 and 8. The avalanche diode of FIG. 10 is characterized by extremely hard reverse voltage-current characteristics with an abrupt avalanche breakdown, in addition to a low junction capacitance which, at zero bias, has been observed to be as low as 58 pf/$cm^2$. Because of the extremely low junction capacitances in the avalanche diode of the invention, as compared with those achieved in the prior art, which are typically in the area of $50 \times 10^3$ picofarad/$cm^2$, the avalanche heterodiode of the invention is capable of operating efficiently at much higher frequencies than prior art avalanche diodes of either the homojunction or heterojunction type. Since the avalanche diode of the invention can have cross-sectional areas much larger than the prior art diodes and yet still have a lower junction capacitance for the same breakdown voltage and current density, the avalanche diode of the invention can operate at higher power and/or frequencies.

The heterojunction embodied in the avalanche diodes illustrated in FIG. 10 should preferably satisfy the conditions for an optimum heterojunction set forth above and may be advantageously fabricated by the process previously described hereinabove.

Figure 11:
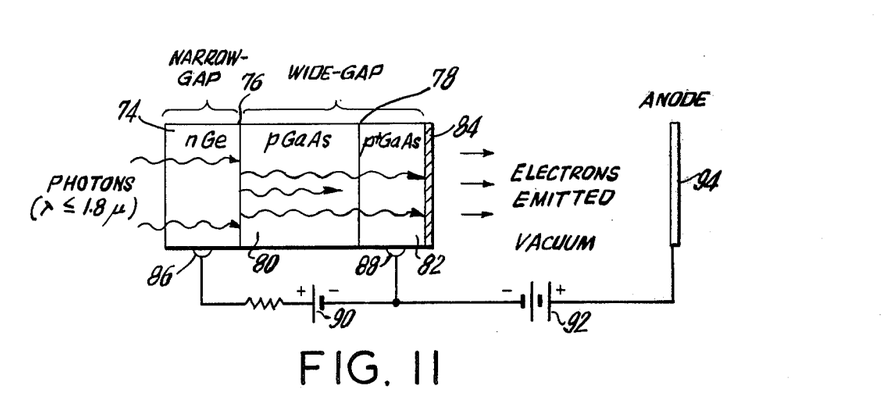
FIG. 11 is a diagrammatic representation of a photocathode according to one embodiment of the invention.

The photocathode shown in FIG. 11 is in the form of a semiconductor heterojunction which is reverse-biased in, or near, the avalanche mode. The photocathode includes a first n-type narrow-gap layer or region 74, such as Ge, forming a heterojunction at 76 with a p-type wide-gap region made, for example, of GaAs. This region may include, as shown, a lower doped p-region 80 adjacent to an isotype junction 78, and a higher doped or $p^+$-region 82 adjacent to a coating or surface 84 of a low work function material such as Cs or Cs—O. The photocathode is enclosed within a vacuum and is respectively connected at ohmic contacts 86 and 88 to the positive and negative terminals of a d.c. voltage source 90 to reverse bias the heterojunction, and through an additional d.c. voltage source 92 to an anode 94.

In operation, to detect infrared radiation, the region 74 which receives the incident radiation preferably has (1) a relatively narrow energy gap (such as Ge) whose conductivity type is n; and (2) a width smaller than the diffusion length of minority carriers so that the generated holes may be collected in sufficient numbers at the heterojunction. The other side of the heterojunction should, as shown, be a p-type semiconductor crystal with a relatively large energy gap. For photoemission, region 82 must be heavily doped, althrough in some applications, if the doping level is not critical, regions 80 and 82 may merge to be one region with a doping level of $p^+$. The total width of regions 80 and 82 should preferably be smaller than an optical absorption length or a minority-carrier diffusion length, or both, so that any photons initiated at the Ge/GaAs heterojunction 76 may travel through regions 80 and 82 without appreciable attenuation and/or minority electrons generated in either of regions 80 and 82 will diffuse and arrive in sufficient numbers at the GaAs/Cs or Cs—O surface 84.

The narrow-gap and wide-gap semiconductors constituting the photocathode, as in the other heterojunction devices disclosed herein, should be compatible in the sense that both semiconductor materials should have: (1) the same crystalline structure; (2) the same lattice parameters, or nearly so; and (3) the same thermal expansivity, or nearly so between the growth and room temperatures, when one semiconductor is grown on the other.

An example of a proper material for regions 80 and 82 is a p-type GaAs as shown in FIG. 11. The nGe, pGaAs and $p^+$GaAs regions 74, 80 and 82 and the junctions therebetween are all joined together in a single crystalline structure.

The nGe/PGaAs junction is reverse-biased in or near the avalanche mode. Upon the incidence of photons of wavelengths $\lambda \leq 1.8$ microns, into the Ge layer or region, electron-hole pairs will be generated and the holes will diffuse toward the nGe/pGaAs junction. A sufficiently-large number of these holes will arrive at the junction, since the width of the layer 74 is much less than a diffusion length. The rate of arrival per second of the generated holes will depend on the intensity of the infrared radiation penetrating the nGe region.

As these primary holes arrive at the heterojunction they will, depending on their rate of arrival per second, initiate or intensify the avalanche process in the nGe/p-GaAs heterojunction. This avalanche breakdown will be associated with a wide-band spectrum of emitted photons, some of which are in the visible range. About half of these photons will travel to the right (as viewed in FIG. 11) and those photons with energy higher than that of the GaAs energy gap will generate electron-hole pairs. If the total width of regions 80 and 82 is less than an optical absorption length, the radiation will reach surface 84 where it creates surface emission of electrons which will be collected by anode 94. If the total width of regions 80 and 82 is appreciably shorter than a diffusion length, the electrons created by radiation through these two p-regions will diffuse through to surface 84 where they will enhance the electrons generated at the surface by the radiation as described earlier.

In order to satisfy these conditions, the total width of the device of FIG. 11 may be too thin to be of sufficient mechanical strength. In this case, the photocathode may additionally be provided with a supportive substrate which may preferably be an $n^+$ type wide-gap semiconductor, such as GaAs. This supportive substrate layer would be contiguous to region 74 and both regions together with the heterojunction therebetween form a continuous crystalline structure. When such a supportive layer is employed, the negative battery terminal shown in FIG. 11 would be connected to the $n^+$ wide-gap region through a suitable ohmic contact. In this case no electrode would be connected to region 74.

Figure 12:
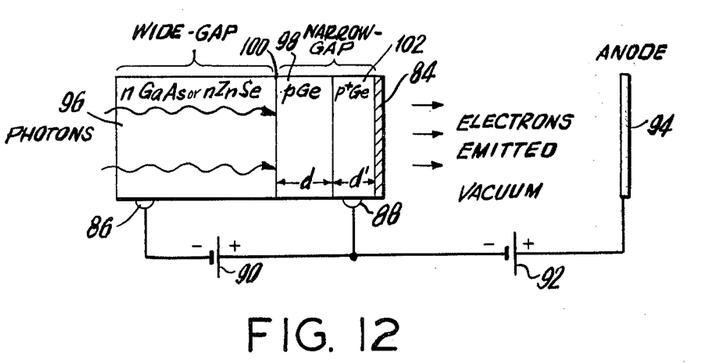
FIG. 12 is a diagrammatic representation of an alternative embodiment of a photocathode according to the invention.

The photocathode illustrated in FIG. 12 consists of a wide-gap n-type semiconductor crystal region 96, such as GaAs or ZnSe, on which a thin layer 98 (of width $d$) of a p-type semiconductor with a narrow energy gap, such as Ge, is formed, region 96 and layer 98 defining a heterojunction 100 therebetween. Layer 98 is followed by a thin layer 102 (of width $d'$) of $p^+$ semiconductor material which is the same as that of the layer 98, and is surface treated by Cs or Cs—O as shown at surface 84. The width $d'$ of layer 102 should preferably be shorter than the width $d$ of layer 98. Furthermore, the sum of ($d + d'$) should be much shorter than the diffusion length for minority carriers and preferably much shorter than an optical absorption length in the narrow-gap semiconductor layer.

In the operation of the photocathode of FIG. 12, infrared radiation falls on the region 96, which acts as a window for photons with energy $\leq 2.67$ eV (energy gap of ZnSe), that is, with a wavelength [$\geq 0.46$ microns. Such photons will proceed unattenuated through region 94 until the heterojunction 100 where significant absorption will occur in the p-type Ge. Consequently, minority electrons will be generated. If the device is sufficiently forward-biased, the injected electron current will diffuse through $p^-$ region 98 and $p^+$ region 102 to the Ge surface treated with Cs, or Cs—O where they will be emitted in the vacuum. Subsequently, the electrons will be drawn by anode 94.

It will be appreciated from the foregoing that the present invention provides a novel heterojunction semiconductor device exhibiting, inter alia, improved high frequency and power output characteristics. Specific embodiments of the invention have been described with respect to: an improved wide-gap heterodiode with an isotype emitter; an improved heterotransistor with a wide-gap isotype emitter; a wide-gap collector heterostructure transistor with a wide-gap emitter and wide-gap collectors; an improved avalanche heterodiode, and an improved heterojunction photocathode.

It is to be understood that one skilled in the art would be able, without undue experimentation, to choose other compatible semiconductor materials and to use other processes providing that the teachings of the invention as herein provided are observed. For example, if the narrow-gap semiconductor material is Ge, a compatible wide-gap semiconductor material may be chosen out of any one of the following: GaAs, ZnSe, $Al_xGa_{1-x}As$, $In_xGa_{1-x}As$, $GaAs_xSb_{1-x}$, $ZnSe_xTe_{1-x}$, $Ge_{0.9}Si_{0.1}$, and the like.

Additional lists of compatible materials may be obtained on the basis of the criteria mentioned earlier from a number of references such as: A. G. Milnes and D. L. Feucht, "Heterojunctions and Metal-Semiconductor Junctions," Academic Press, 1972, p.9.

Thus, although the invention has been particularly shown and described with reference to several presently preferred embodiments thereof, it will be understood by those skilled in the art that the preceding and other changes in form and details may be made therein without departing from the spirit and scope of the invention.

What is claimed is:

1. A semiconductor heterotransistor comprising a collector region of a wide-gap semiconductor material of one conductivity type and a base region of a narrow-gap semiconductor material of an opposite conductivity type immediately contiguous thereto and defining a p-n heterojunction therewith, said base region being contiguous to an emitter region on the opposite side of the base-collector heterojunction and defining a p-n homojunction therewith, said emitter region being formed of the same narrow-gap semiconductor material as said base region, said base and emitter regions being of opposite conductivity types, the doping level of said emitter region being higher than that in said base region, the doping level in said collector region being less than in said base region, said wide-gap collector and said narrow-gap base regions and the heterojunction therebetween forming a continuous single crystalline structure.

2. The heterojunction of claim 1, in which said wide-gap collector region includes an inner collector region contiguous to said base-collector junction and an outer collector region of the same conductivity type as said inner collector region, said inner collector region having a doping level lower than that in said outer collector region.

3. The heterotransistor of claim 1, in which the semiconductor materials of said emitter, base and collector regions are respectively selected from the group of compatible semiconductor materials consisting of Ge, ZnSe, GaAs, $Al_xGa_{1-x}As$, and $In_xGa_{1-x}As$, with the value of $x$ ranging between 0 and 1.

4. A semiconductor microwave avalanche diode comprising a wide-gap region and a narrow-gap region of opposite conductivity types joined together as a continuous single crystalline structure having a p-n heterojunction therebetween, and means for maintaining a reverse-bias across said heterojunction of a value sufficient to deplete said wide-gap region and for causing said p-n heterojunction to undergo avalanche breakdown with carriers drifting across said depleted region to produce microwave oscillation at a frequency determined by the transit time across the depletion layer.

5. The semiconductor device of claim 4, in which said wide-gap semiconductor region includes an inner zone adjacent to said heterojunction and an outer zone of the same conductivity type as said inner zone, said inner zone having an impurity concentration less than that in said outer zone.

6. The semiconductor device of claim 4, in which said narrow-gap semiconductor region includes an inner zone adjacent to the heterojunction, and an outer zone of the same conductivity type as said inner zone, said inner zone having an impurity concentration of at least one order of magnitude less than that in said outer zone.

* * * * *

UNITED STATES PATENT OFFICE
CERTIFICATE OF CORRECTION

Patent No. 4,119,994            Dated October 10, 1978

Inventor(s) F. C. Jain and Mahmoud A Melehy

It is certified that error appears in the above-identified patent and that said Letters Patent are hereby corrected as shown below:

Claim 2, column 10, line 47, change "heterojunction" to

-- heterotransistor --.

Signed and Sealed this

Sixth Day of February 1979

|SEAL|

Attest:

RUTH C. MASON
Attesting Officer

DONALD W. BANNER
Commissioner of Patents and Trademarks